United States Patent [19]

Sano et al.

[11] Patent Number: 4,901,285

[45] Date of Patent: Feb. 13, 1990

[54] HIGH DENSITY READ-ONLY MEMORY

[75] Inventors: Jun-ichi Sano, Chelmsford; Moshe Mazin, Andover; Lance A. Glasser, Lexington, all of Mass.

[73] Assignee: Raytheon Company, Lexington, Mass.

[21] Appl. No.: 316,590

[22] Filed: Feb. 27, 1989

Related U.S. Application Data

[63] Continuation of Ser. No. 133,226, Dec. 14, 1987, abandoned, which is a continuation of Ser. No. 813,290, Dec. 24, 1985, abandoned.

[51] Int. Cl.$^4$ .................................................. G11C 8/00
[52] U.S. Cl. .............................. 365/230.01; 365/104; 365/230.06
[58] Field of Search ........... 365/104, 189, 230, 189.01, 365/230.06

[56] References Cited

U.S. PATENT DOCUMENTS 4,301,518  11/1981  Klaas ................................... 365/
4,314,362  2/1982  Klass et al. ......................... 365/205

Primary Examiner—James W. Moffitt
Attorney, Agent, or Firm—Philip J. McFarland; Richard M. Sharkansky

[57] ABSTRACT

An integrated circuit memory having a plurality of row lines; a plurality of select lines; a plurality of output lines; a plurality of memory cells; each pair of memory cells having common outputs coupled to a select one of the plurality of output lines and common address inputs coupled to a select one of the plurality of row lines, wherein ambiguity of which memory cell of the pair of memory cells to be selected, being coupled to a select one of the plurality of row lines and a select one of the plurality of output lines, is determined by two selected ones of the plurality of select lines coupled thereto. Also provided is a first decoder, responsive to an input address, for enabling a select one of the plurality of row lines, and a second decoder, responsive to the row lines and to the input address, for enabling a select one of the select lines which corresponds to pairs of memory cells with an enabled row line.

1 Claim, 6 Drawing Sheets

FIG. 1

| FIG. 1A |
|---|
| FIG. 1B |

FIG. 4

| FIG. 4A | FIG. 4B |
|---|---|

HIGH DENSITY READ-ONLY MEMORY

This application is a continuation of application Ser. No. 133,226 filed Dec. 14, 1987, now abandoned, which is a continuation of application Ser. No. 813,290 filed Dec. 24, 1985, now abandoned.

BACKGROUND OF THE INVENTION

This invention relates generally to integrated circuit memories, and more particularly, to read-only integrated circuit memories (ROMS).

As is known in the art, one type of digital memory is a read-only memory (ROM). One type of such ROM is a so-called X-ROM described in an article entitled "A 100ns 150 mW 64K Bit ROM" by D. R. Wilson and P. R. Schroeder, ISSCC DIGEST OF TECHNICAL PAPERS, pp. 152-153, 273, Feb. 1978. This paper discloses a memory having a first set of horizontally extending row electrical conductors or row lines, and two sets of vertically extending electrical conductors, one set called data lines and the other set called column lines. The data lines and column lines are physically arranged in an alternating pattern. The column lines are themselves alternately interconnected to form two groups of column lines. The bit lines carry data from the memory cells to sense amplifiers. Memory cells are arranged in an array NxM in regions bounded by the two sets of column lines and the set of row lines. Each memory cell is coupled to an adjacent column line, an adjacent bit line, and an adjacent row line. Memory cells are selected by enabling one column line and one row line. Therefore, each row address conductor has M memory cells coupled thereto and each column line has 2N memory cells coupled thereto. During an access of the memory, one of the row lines is enabled and one of the two groups of column lines is enabled. This causes those memory cells coupled to the enabled row line and to the enabled column lines to transfer their stored information to their respective bit lines. Each column line is heavily loaded capacitively because of the 2N memory cells coupling to it. This capacitive loading reduces access time of the memory due to a delay necessary to insure complete charging of the heavily loaded column lines. To reduce this delay, large, high power column line drivers are required. Therefore, with each access of the memory, one set of the column line and associated drivers are active, causing high power dissipation and high electrical noise generation. Due to the physical structure of the memory, these column line drivers and associated column line decoders are located apart from row line drivers and associated row line decoders. By using separate row line and column line decoders with large column line drivers, less area is available to the memory for memory cells.

It is therefore an object of this invention to provide a high density memory with a structure that has reduced loading on the column lines to allow smaller, lower power drivers for the column lines.

It is a further object of this invention to provide a high density memory with a structure that allows a common decoder circuitry for both column and row lines.

Another object of this invention is to provide a decoder which uses common circuitry to drive the column and row drivers.

SUMMARY OF THE INVENTION

These objects and other objects of this invention are obtained generally by having select lines (equivalent to the column lines in the prior art) arranged such that they correspond and are parallel to the row lines. Additionally, the select lines are independent of each other. In an NXM memory array, there are N row lines, N/2 select lines, each row address line couples to M memory cells and each select address line couples to M memory cells (instead of the 2N memory cells per column line in the prior art). In a typical memory having an equal number of rows and columns (N=M), each select line has half the capacitive loading a column line in the prior art has. During a read of the memory, a row line is enabled and only those select lines corresponding to the enabled row line (typically one or two) are enabled instead of half of the column lines as in the prior art. Therefore, with each select line being lightly loaded and with only open or two of corresponding select lines enabled, less electrical noise is generated and less power is dissipated during a read of the memory compared to the prior art. The smaller loading on the select lines allows smaller, less powerful drivers to drive these select lines compared to the column line drivers needed in the prior art. Also, by having the select lines independent from each other and each corresponding to a row line, decoders for the select lines (corresponding to the column decoders of the prior art) can share decoding logic with the row decoders. These features allow more area to be available for memory cells.

To drive this novel nonvolatile integrated circuit memory, in accordance with the present invention, an address and select line decoder is provided which uses multiple stages of decoders to decoder an input address. Decoding of the input address has several common stages of decoding, allowing an efficient scheme to enable one row line and have only those select lines enabled that correspond to that enabled row line. By enabling only those select lines that correspond to an enabled row line, power dissipation, electrical noise generation and access time of the memory is reduced. Additionally, common decoder circuitry allows more chip area available for memory cells.

BRIEF DESCRIPTION OF THE DRAWINGS

The foregoing features of this invention, as well as the invention itself, may be more fully understood from the following detailed description read together with the accompanying drawings, in which:

FIG. 1 diagrams the relationship between FIGS. 1A, 1B;

FIG. 4 diagrams the relationship between FIGS. 4A, 4B;

DESCRIPTION OF THE PREFERRED EMBODIMENT

Figures 1A, 5A, 5B:
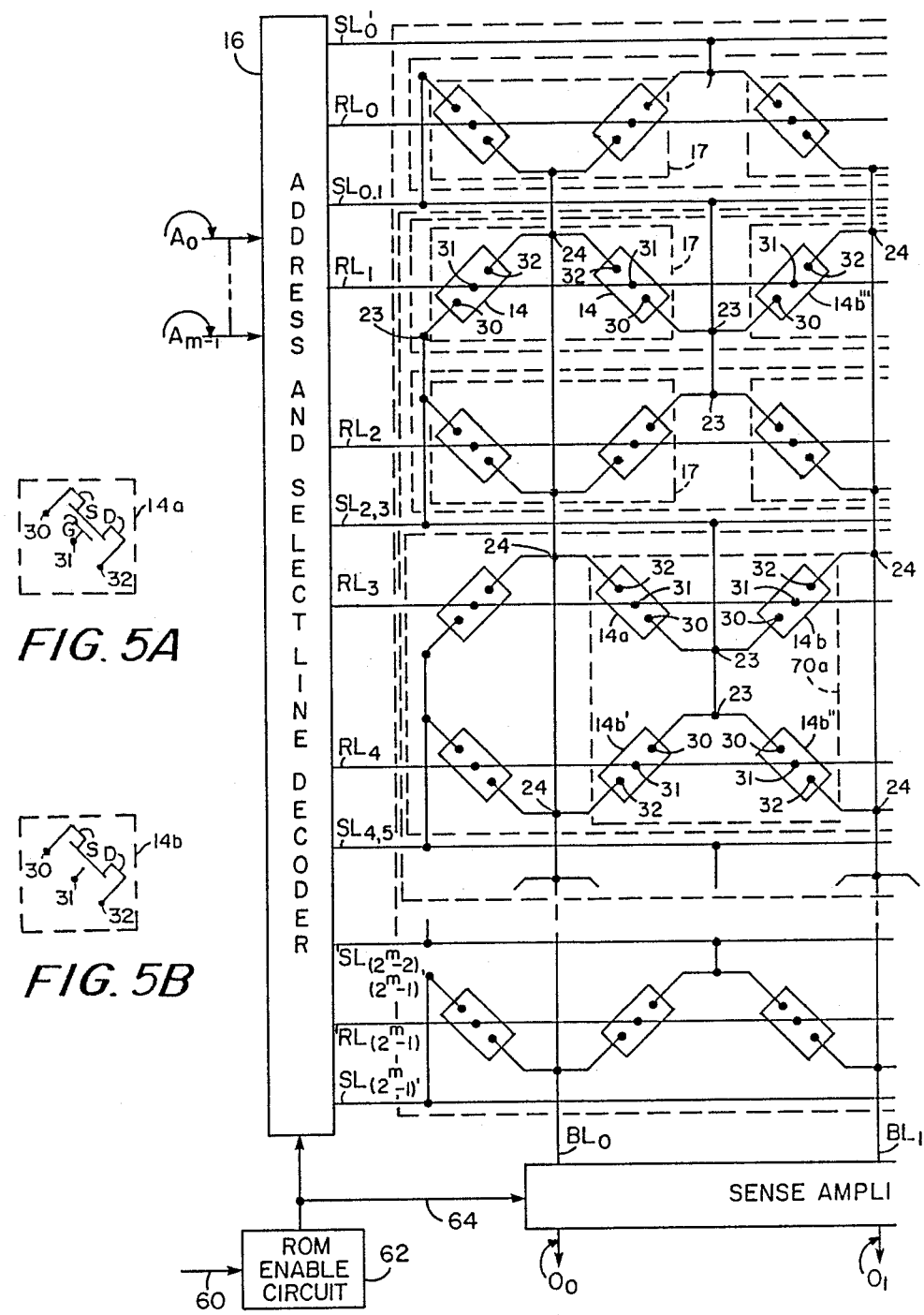
FIGS. 1A, 1B are symbolic representations of a read-only memory according to the invention.
FIG. 5A is a schematic diagram of a memory cell programmed to have transistor action, storing a logical 0.
FIG. 5B is a schematic diagram of a memory cell programmed to have transistor action inhibited, storing a logical 1.
Figure 1B:
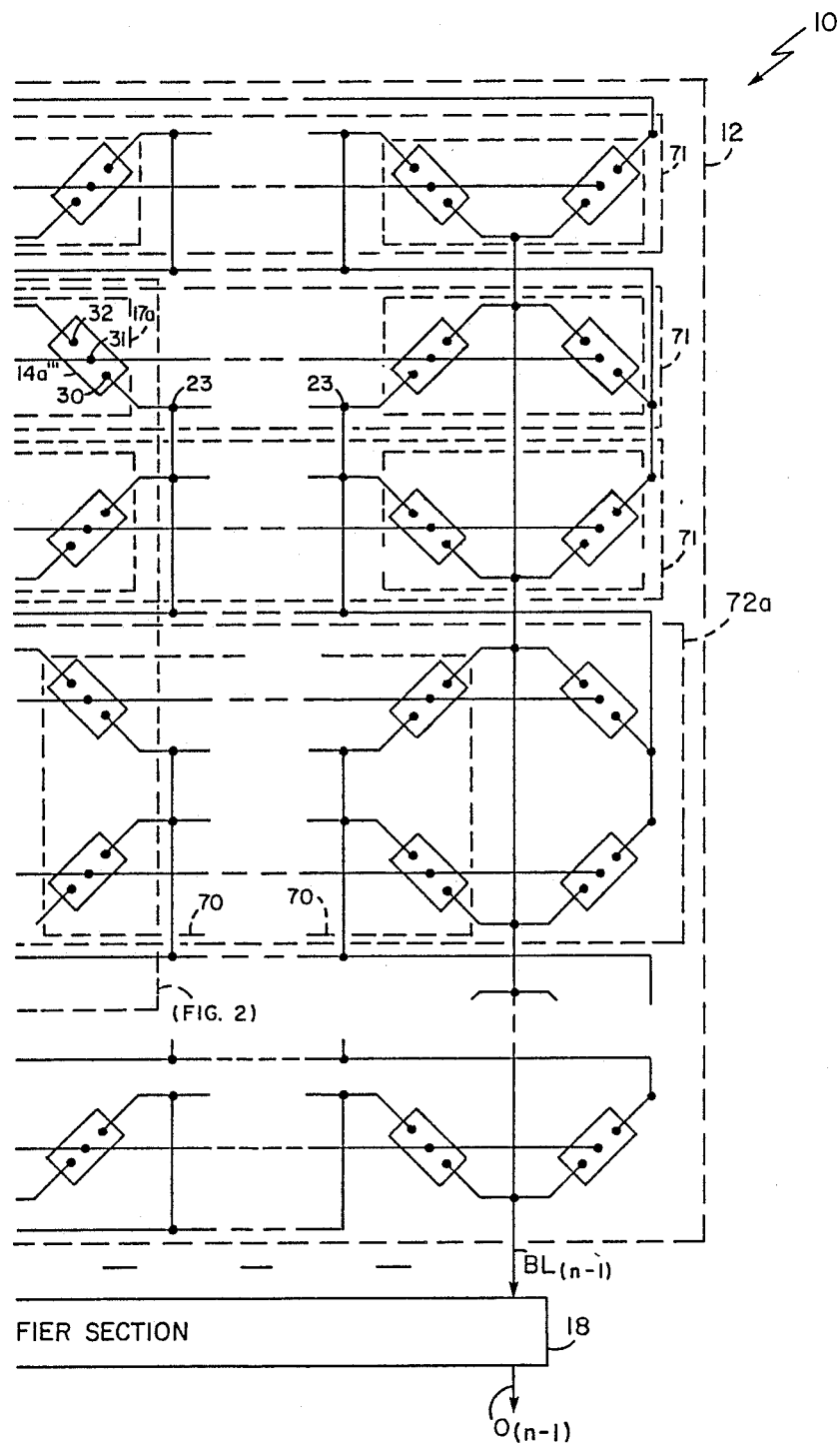

Referring to FIGS. 1, 1A, 1B, a semiconductor integrated circuit memory (ROM) 10 is shown to include: an array 12 of memory cells 14, arranged in pairs 17. The memory cells 14 are arranged in a matrix of $2^m$ rows 71 and n columns (not numbered), as shown, storing $2^m$ by n bit digital words, where m is the number of bits used to address to address the ROM 10. Corresponding with each row 71 are a pair of $2^{m-1}$ select lines $SL_0'$-$SL_{(2^m-1)}'$. One of the pair of corresponding select lines $SL_0'$-$SL_{(2^m-1)}'$ is connected to a first one of the memory cells 14 in each pair 17 and the second one of the pair of corresponding select lines $SL_0'$-$SL_{(2^m-1)}'$ is connected to the other one of the memory cells 14 in the pair 17. It is next noted that a pair of adjacent row lines $RL_0$-$RL_{(2^m-1)}$ is disposed between successive select lines $SL_0'$-$SL_{(2^m-1)}'$ and each row line $RL_0$-$RL_{(2^m-1)}$ couples to each memory cell 14 in corresponding rows 71. The memory 10 also includes: an address and select line decoder 16; a sense amplifier section 18; and a ROM enable circuit 62. The address and select line decoder 16 will be discussed in more detail in connection with FIG. 4. Suffice it to say here, however, that decoder 16, enables, or addresses, one of $2^m$ row conductors (i.e., row lines $RL_0$-$RL_{(2^m-1)}$), as shown, selectively in accordance with address signals on lines $A_0$-$A_{m-1}$. More particularly, decoder 16 drives all but one of the row lines $RL_0$-$RL_{(2^m-1)}$ "low" (to ground) while driving the enabled or addressed row line $RL_0$-$RL_{(2^m-1)}$ "high" ($+V_{DD}$). In addition, the address and select line decoder 16 enables, or addresses, a selected two of the select lines $SL_0'$-$SL_{(2m-1)}'$, corresponding to the enabled row line $RL_0$-$RL_{(2m-1)}$ during a read of the ROM. Column conductors, or bit lines $BL_0$-$BL_{(n-1)}$, carry the binary data accessed in addressed memory cells 14 to the sense amplifier section 18 to thereby read from the memory cell array 12 the n-bits of the addressed one of the $2^{m+1}$ n-bit digital words stored in such ROM 10; such digital words having been masked programmed into the ROM 10 during its fabrication as an integrated circuit. Here the sense amplifiers in the sense amplifier section 18 are of a conventional design, each one thereof being coupled to a corresponding one of the bit lines $BL_0$-$BL_{(n-1)}$ to produce at the output of such sense amplifier section 18 an n-bit digital word $O_0$-$O_{(n-1)}$. The sense amplifier section 18 and address and select line decoder 16 are controlled by the ROM enable circuitry 62 by the enable signal on line 64. An external input chip enable signal fed to input 60 controls ROM enable circuitry 62 by enabling ROM enable circuitry 62 when a ROM read cycle is requested (input 60 is "high") and disabling it when in the standby mode (input 60 is "low"). Referring now to a memory cell pair 17, each memory cell 14 in that pair 17 has an output terminal 32, enable terminal 30 and an address terminal 31 disposed between the enable terminal 30 and the output terminal 32. The output terminals 32 in each memory cell pair 17 coupled to a common output terminal 24, which is in turn coupled to a corresponding bit line $BL_0$-$BL_{(2m-1)}$. The address terminals 31 of all of the memory cells 14 in each memory cell row 71 are coupled to a corresponding one of the row lines $RL_0$-$RL_{(2m-1)}$. The select lines $SL_0'$-$SL_{(2m-1)}'$ are disposed adjacent to alternating memory cell rows 71. The enable terminal 30 of a first one of the memory cells 14 in each memory cell pair 17 couples to a first one of the adjacent select lines $SL_0'$-$SL_{(2m-1)}'$ and the enable terminal 30 of the second one of the memory cells 14 of the pair 17 couples to a different one of the adjacent select lines $SL_0'$-$SL_{(2m-1)}'$. Because each memory cell 14 of each memory cell pair 17 is coupled to a different one of the select lines $SL_0'$-$SL_{(2m-1)}$, when the corresponding row line $RL_0$-$RL_{(2m-1)}$ is enabled, the binary data stored in one of the memory cells 14 is passed to the common output terminal 24. Therefore, two memory cells 14 coupled to a common output terminal 24 cannot be enabled simultaneously.

Referring to FIGS. 5A, 5B, the contents of the memory cells 14 are shown. Here each memory cell 14 (FIGS. 1A, 1B) is an n-channel enhancement mode metal oxide semiconductor (MOS) field effect transistor (FET). The output terminal 32 couples to the drain D, the enable terminal 30 couples to the source S and the address terminal 31 couples to the gate G of the FET. Each one of the cells 14 (FIGS. 1A, 1B) is programmed to have transistor action (to store a logic 0), as shown in FIG. 5A, or is programmed not to have transistor action (to store a logic 1) as shown in FIG. 5B. Transistor action occurs where signals on the address terminal 31 can control the conductivity between the drain D and the source S (FIG. 5A). Transistor action is inhibited where signals on the address terminal 31 cannot control the conductivity (FIG. 5B). When transistor action is inhibited, a high impedance state exists between the source S and drain D. When cell 14a is enabled, a low impedance state exists between the drain D and the source S.

Referring back to FIGS. 1A, 1B, during operation of ROM 10 while not being read (standby mode), the ROM enable circuitry 62, controlled by input 60 being "low", puts the ROM 10 in a pre-charge state by placing a disable signal on line 64. In the pre-charge state, address and select line decoder 16 is disabled so that all the row lines $RL_0$-$RL_{(2m-1)}$ are "low" (ground) and all the select lines $SL_0'$-$SL_{(2m-1)}'$ are "high" ($+V_{DD}$). Further, while in the pre-charge state, the disable signal on line 64 disables the sense amplifiers in the sense amplifier section 18 to pre-charge the bit lines $BL_0$-$BL_{(n-1)}$ to $+V_{DD}$. When a read cycle is desired, the input 60 is "high", the ROM enable circuit 62 sends an enable signal on line 64, releasing the address and select line decoder 16 and the sense amplifiers in sense amplifier section 128 to access the desired memory cells 14. Operation of the ROM 10 during a read cycle, while referring specifically, by way of example, to enable signals on row line $RL_1$, select lines $SL_{0,1}$ and $SL_{2,3}$, and an exemplary pair of memory cells 17a connected to bit line $BL_1$, it is first noted that an enable signal on row line $RL_1$ (a "high") and select line $SL_{2,3}$ (a "low") places the memory cell $14a'''$ into a conduction condition (having been programmed with transistor action), to discharge the stored charge over bit line $BL_1$ from $+V_{DD}$ toward ground. This reduction in voltage from $+V_{DD}$ is detected by the sense amplifier coupled to bit line $BL_1$ as a logical 0. It is noted that all other memory cells 14 coupled to bit line $BL_1$ will not have any effect on bit line $BL_1$, because all other row lines $RL_0$, $RL_2$-$RL_{(2m-1)}$ will be "low" thereby inhibiting the enabling of those other memory cells 14. When an enable signal is placed on row line $RL_1$ and select line $SL_{0,1}$, memory cell 14''' is accessed, but transistor action in cell 14b''' is inhibited. Therefore, the voltage on bit line $BL_1$ stays at $+V_{DD}$, indicating a logical 1 to the sense amplifiers in sense amplifier section 18.

Figure 2:
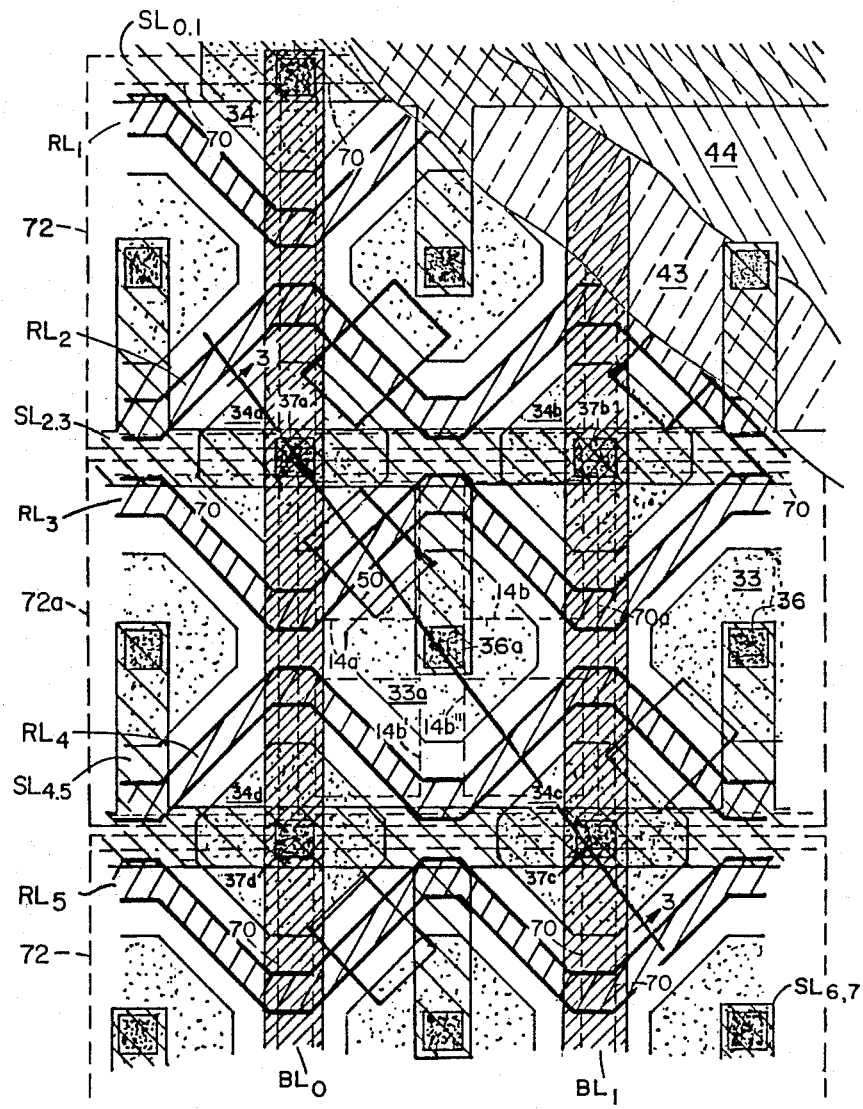
FIG. 2 is a diagrammatical view of a portion of the memory array used in the read-only memory shown in FIG. 1.
Figure 3:
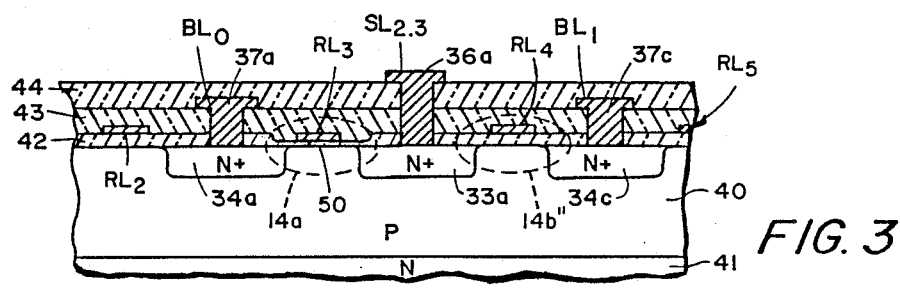
FIG. 3 is a cross-section elevation view taken along line 3—3 of FIG. 2.

Referring now to FIGS. 2 and 3, it is noted that FIG. 3 is a cross-sectional view along the 3—3 line in FIG. 2. It is additionally noted that each one of the memory cells 14 are formed in different regions of the semiconductor body used to fabricate the ROM 10 as an integrated circuit. During fabrication of the ROM 10 as an integrated circuit, those memory cells which are to store a logic 0 data bit have formed in that element an FET having transistor action, designated here as 14a (FIG. 5A). A memory cell 14 that stores a logical 1 by having its transistor action is designated as 14b (FIG. 5B).

Referring to FIG. 3, N+type conductivity regions 33a and 34a, 34c, forming the source S and drain D of cells 14a, 14b (FIGS. 5A, 5B), are diffused into a grounded p-type conductivity ground well 40. This well 40 is electrically coupled to ground through a ground bus (not shown). This well 40 is disposed in an n-type conductivity silicon substrate 41. Referring to FIGS. 2 and 3, the row lines $RL_0$-$RL_{(2m-1)}$ consist of doped polycrystalline silicon (polysilicon), with portions thereof providing gate electrodes G (FIGS. 5A, 5B). Further, as described above, the gate electrode G (FIG. 5A) of memory element 14a is disposed over a thin silicon dioxide insulating layer 42 in etched area 50 (FIG. 3) of silicon dioxide on the portions of the surface of the well 40 between the regions 33a and 34a to provide an n-channel enhancement mode FET. A thick portion of silicon dioxide insulating layer 42 is formed between the regions 33a, 34c to destroy any gate channel between such regions 33a, 34c and thus inhibit transistor action between regions 33a, 34c. It is here noted that while the use of a thick oxide layer between the source and drain regions to prevent transistor action has been described, other conventional techniques can be used to prevent such transistor action, such as active area removal or implantation into the channel region to raise the transistor threshold for conducting current. The bit lines $BL_0$-$BL_{(n-1)}$ are formed by a first level of metallization insulated from the polysilicon row lines $RL_0$-$RL_{(2m-1)}$ by oxide layer 43, and are arranged perpendicularly to the row line $RL_0$-$RL_{(2m-1)}$. The select lines $SL_0'$-$SL_{(2m-1)}'$ are formed by a second level of metallization insulated from the bit lines $BL_0$-$BL_{(n-1)}$ by oxide layer 44, and are arranged to parallel the row lines $RL_0$-$RL_{(2m-1)}$. These select lines $SL_0'$-$SL_{(2m-1)}'$ are coupled to corresponding ntype conductivity regions 33 via contacts 36, such regions being diffused within well 40. It is further noted that in an actual realization of this ROM, the second level of metallization first couples to a first level of metallization which, in turn, couples to the n+ type conductivity region instead of directly going from a second level of metallization to the n+ type conductivity region as shown. For simplicity and clarity, the direct coupling from the second level metal to the n+ type conductivity region is shown. The bit lines $BL_0$-$BL_{(n-1)}$, deposited over n+ regions 34, are coupled thereto via contacts 37, such regions being diffused within well 40. The select lines $SL_0'$, $SL_{(2m-1)}'$ are arranged in rows such that they cross the semiconductor bulk comprising the ROM array over where the bit lines $BL_0$-$BL_{(n-1)}$ couple to the n+region contacts 37. The columns of bit lines $BL_0$-$BL_{(n-1)}$ and the rows of select lines $SL_0'$-$SL_{(2m-1)}'$ form rows and columns of regions 70, each region 70 having four memory cells 14 (FIGS. 1A, 1B). Rows and columns of these regions 70 form rows and columns of common enable terminals 36. The address terminals 31 (FIGS. 1A, 1B) for each memory cell in region 70 are disposed between the common enable terminal 36 and each of the output terminals by the polysilicon row lines $RL_0$-$RL_{(2m-1)}$. A row 72 of regions 70 with common enable terminals 36 has first alternating ones of the common enable terminals coupling to an adjacent select line $SL_0'$-$SL_{(2m-1)}'$ and second alternating ones of the common enable terminals 36 coupling to a different, adjacent select line $SL_0'$-$SL_{(2m-1)}'$. For example, in a selected row 72a (see also row 72a in FIGS. 1A, 1B), a n+ region 33a in the center of region 70a forms a common source S (FIGS. 5A, 5B) via contact 36a (terminals 23 in FIGS. 1A, 1B) for each of the four memory cells (14a, 14b, 14b', 14b''). The n+ regions 34a-34d at the corner of the region 70a, which couple to bit lines $BL_0$, $BL_1$ via contacts 37a-37d (terminals 24 in FIGS. 1A, 1B), form the drain D (FIGS. 5A, 5B). Terminal 36a couples to select line $SL_{2,3}$ while adjacent regions 70 in row 72a couple to a different, adjacent select line $SL_{4,5}$. Row lines $RL_3$ and $RL_4$ form the address terminals 31 (FIGS. 1A, 1B) and gates G (FIGS. 5A, 5B) for cells 14a', 14b' and cells 14a, 14b, respectively.

Figure 4A:
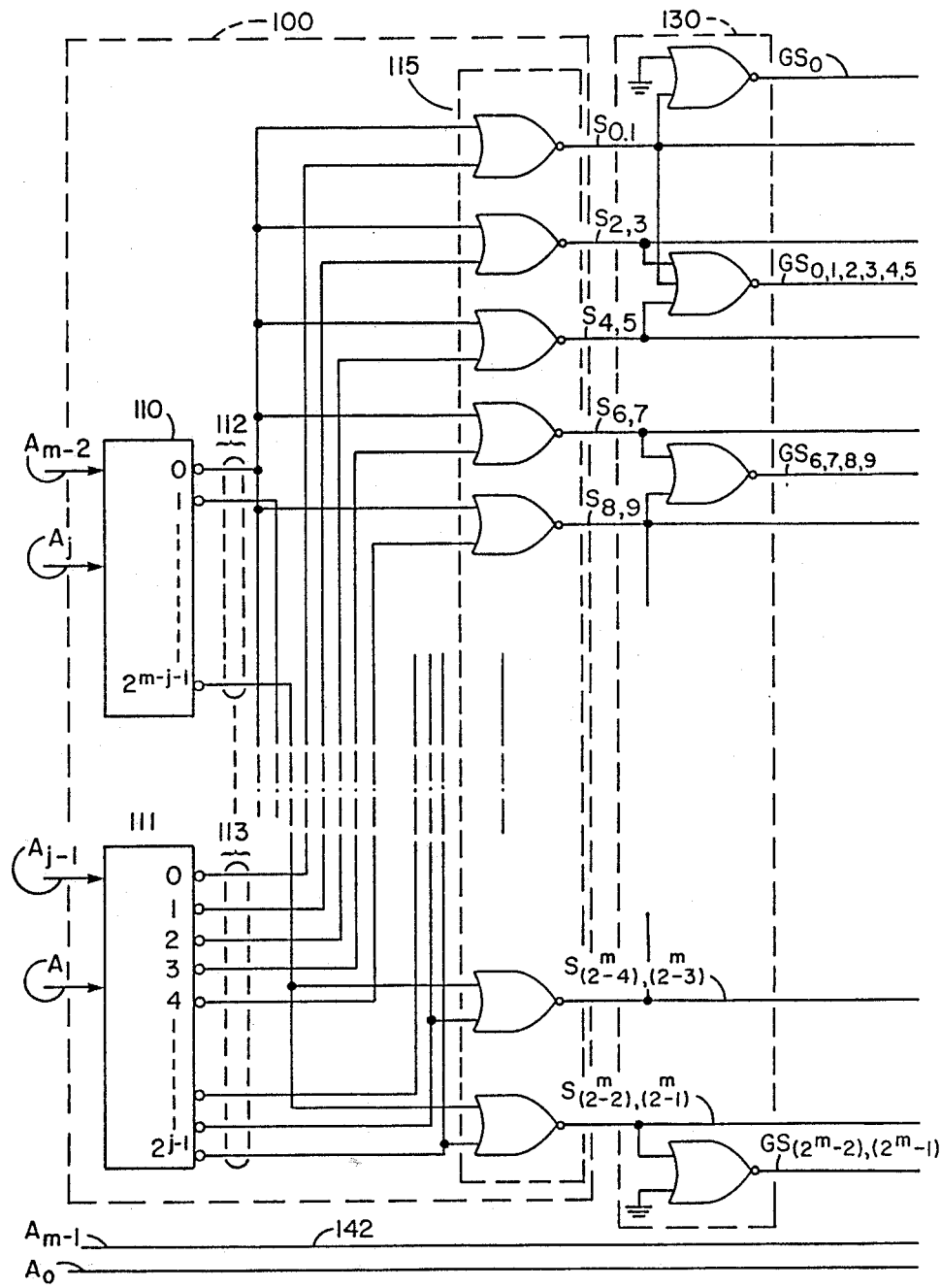
FIGS. 4A, 4B are schematic diagrams of the address and virtual ground decoder according to the invention.
Figure 4B:
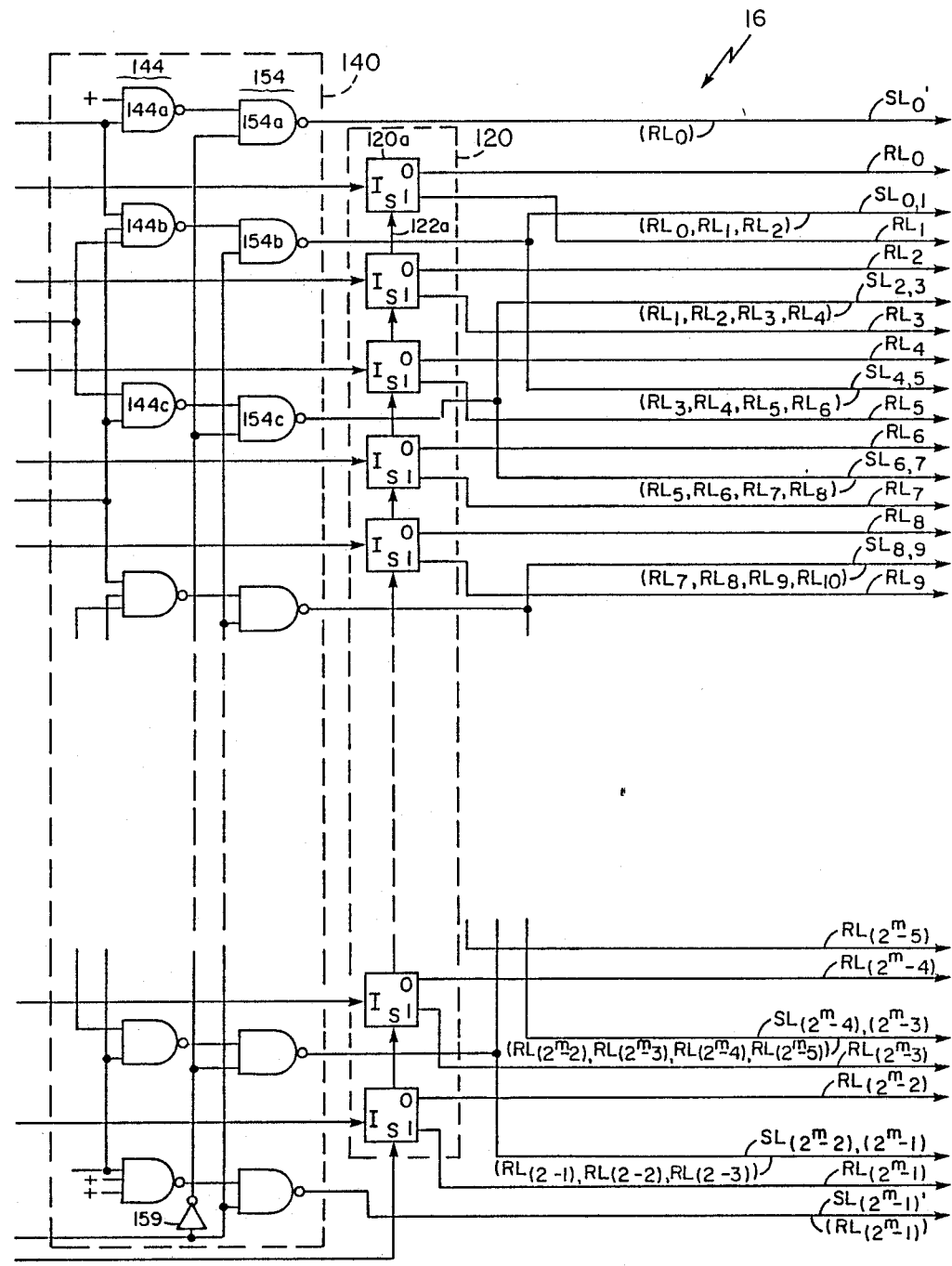

Referring to FIGS. 4A, 4B, the address and select line decoder 16 (FIGS. 1A, 1B) is diagrammed. A conventional decoder 100 selects one of the outputs $S_{0'1}$-$S_{(2m-2),(2m-1)}$ in response to the address line inputs $A_1$-$A_m$. More specifically, the conventional decoder 100 contains two one-of-N decoders 110, 111, each of which respond to separate sets of address inputs, here one-of-N decoder 110 responds to address $A_j$-$A_{m-2}$ and one-of-N decoder 111 responds to address $A_1$-$A_{j-1}$. The outputs of the one-of-N decoders (112 for decoder 110 and 113 for decoder 111) are normally "high" (i.e., unselected outputs from decoders 110 and 111 are "high") and the selected one of each of the outputs 112, 113 is "low". The NOR array 115 logically ANDs (negative logic) the outputs 112, 113 to produce one "high" output $S_{0,1}$-$S_{(2m-2),(2m-1)}$, while remaining $S_{0,1}$-$S_{(2m-2),(2m-1)}$ are low. The outputs $S_{0,1}$-$S_{(2m-2),(2m-1)}$ of the conventional decoder 100 corresponds to a pair of row lines $RL_0$-$RL_{(2m-1)}$ (i.e., $S_{0,1}$ to $RL_0$ and $RL_1$, $S_{2,3}$ to $RL_2$ and $RL_3$, etc.). Selection of which one of the row lines $RL_0$-$RL_{(2m-1)}$ corresponding to the enabling to the enabled one of the outputs $S_{0,1}$-$S_{(2m-2),(2m-1)}$, occurs in the decoder array 120, in response to the select input S to the decoder array 120. The input S is coupled to the address line input $A_0$. For example, if decoder 100 output $S_{0,1}$ is "high" and $A_0$ is "low", decoder 120a, having its select input S "low", would enable $RL_0$. Conversely, if $A_0$ is "high", then $RL_1$ would be enabled. During a ROM read cycle, one of the row lines $RL_0$-$RL_{(2m-1)}$ is "high" corresponding to the state of the $A_0$ address input and the enabled one of the outputs $S_{0,1}$-$S_{(2m-2),(2m-1)}$. The outputs $S_{0,1}$-$S_{(2m-2),(2m-1)}$ *from the conventional decoder 100 also couple to a NOR array 130 which enables a select one of a plurality of row line group select signals* $GS_0$-$GS_{(2m-2),(2m-1)}$. These group select signals designate that a row line $RL_0$-$RL_{(2m-1)}$ in its corresponding group will be enabled. For example, group select signal $GS_{0,1,2,3,4,5}$ being enabled (by being "low"), indicates that one of the row address lines $RL_0$-$RL_5$ will be active. These group select signals then couple to a NAND array 140 which enables a selected one of the plurality of select lines $SL_0'$-$SL_{(2m-1)}$, which corresponds to the selected one of the row address lines $RL_0$-$RL_{(2m-1)}$. The first group of NAND gates 144 in the NAND array 140 logically ORs together those group select signals $GS_0$-$GS_{(2m-1),(2m-1)}$ corresponding to the enabled select lines $SL_0$-$SL_{(2m-1)}$. For example, NAND gate 144b responds to group select signal $GS_0$, $GS_{0,1,2,3,4,5}$ and $GS_{6,7,8,9}$ because select address line $SL_{0,1}$ and select address line $SL_{4,5}$, which are coupled to NAND gate 144b via NAND gate 154b, correspond to row lines $RL_0$, $RL_1$, $RL_2$ and row lines $RL_3$, $RL_4$, $RL_5$, $RL_6$, respectively. Row line $RL_0$-$RL_{(2m-1)}$ which corresponds to a given select line $SL_0'$-$SL_{(2m-1)}'$ is shown in parentheses next to the select address line number. A further example is NAND gate 144c being responsive to group select $GS_{0,1,2,3,4,5}$ and group select $GS_{6,7,8,9}$ which couples via NAND gate 154c to select address lines $SL_{2,3}$ and $SL_{6,7}$. Select address line $SL_{2,3}$ corresponds to row lines $RL_1$, $RL_2$, $RL_3$, $RL_4$ and select line $SL_{6,7}$ corresponds to row lines $RL_5$, $RL_6$, $RL_7$ and $RL_8$. The second group of NAND gates 154 enables the select lines $SL_0'$-$SL_{(2m-1)}'$ such that two memory cells with a common enabled row address line $RL_0$-$RL_{(2m-1)}$ and common output terminal 37 (FIGS. 2, 3, corresponding to paired memory cells 17 in FIGS. 1A, 1B) will not be enabled to the same bit line $BL_0$-$BL_{(n-1)}$ (FIGS. 1A, 1B) simultaneously. This selection is accomplished by the address bit line $A_m$ and inverter 159 (which inverts the address bit line $A_m$) coupling to NAND gates 154 to inhibit adjacent select lines $SL_0'$-$SL_{(2m-1)}'$ from simultaneously being enabled if they have identical corresponding row address lines $RL_0$-$RL_{(2m-1)}$ that are enabled (e.g. $SL_{0,1}$ and $SL_{2,3}$ both have corresponding row lines $RL_1$ and $RL_2$). It is noted that to avoid delays associated with decoding for the row line $RL_0$-$RL_{(2m-1)}$ and then deciding which select line $SL_0'$-$SL_{(2m-1)}'$ is to be enabled, simultaneous row and select line decoding is required. Hence, two stage address decoding for the row lines $RL_0$-$RL_{(2m-1)}$ (decoder 100 and decoder 120) provides a "look ahead", or advanced enabling, from decoder 100 for the select line decoders (NOR array 130, NAND array 140).

Having described a preferred embodiment of this invention, it will now be apparent to one of skill in the art that other embodiments incorporating its concept may be used. Therefore, it is believed that this invention should be not be restricted to the disclosed embodiment, but rather should be limited only by the spirit and scope of the appended claims.

What is claimed is:

1. In a read only memory wherein pairs of field effect transistors, each having actuable gate, drain and source electrodes, are disposed to form an M X N matrix, where M is the number of rows and N is the number of columns in such matrix, with the gate electrode of each one of the N pairs of field effect transistors in each one of the M rows being connected to a "one out of M" decoder so that the gate electrodes of the field effect transistors in a selected row may be actuated and with the drain electrodes of a first one of each one of the M pairs of field effect transistors in each one of the N columns being connected to a first one of corresponding N output lines and the drain electrode of the second one of each one of such M pairs being connected to a second one of the corresponding N output lines so that the drain electrode of each field effect transistor in each one of such M pairs may be separately actuated, the improvement comprising:

(a) means, responsive to the "one out of M" decoder, for producing a first and a second actuating signal for the source electrodes of the N pairs of field effect transistors in the selected row; and (b) means for applying the first actuating signal to the source electrode of the first field effect transistor in each one of the N pairs of field effect transistors in the selected row and for applying the second actuating signal to the source electrode of the second field effect transistor in each one of the N pairs of field effect transistors in the selected row whereby the gate, drain and source electrodes of only a single one of the M pairs of field effect transistors in each one of the N columns may be simultaneously actuated.

* * * * *